United States Patent
Yoshioka

(10) Patent No.: US 7,986,257 B2
(45) Date of Patent: Jul. 26, 2011

(54) COMPARATOR CIRCUIT AND ANALOG DIGITAL CONVERTER HAVING THE SAME

(75) Inventor: Masato Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/537,815

(22) Filed: Aug. 7, 2009

(65) Prior Publication Data
US 2010/0039305 A1    Feb. 18, 2010

(30) Foreign Application Priority Data

Aug. 12, 2008   (JP) .................................. 2008-207942

(51) Int. Cl.
*H03M 1/12* (2006.01)
(52) U.S. Cl. ........................................ 341/155; 341/163
(58) Field of Classification Search .................. 341/155, 341/156, 158, 161, 162, 163
See application file for complete search history.

(56) References Cited

U.S. PATENT DOCUMENTS

| | | | |
|---|---|---|---|
| 5,017,920 A * | 5/1991 | French | 341/163 |
| 7,205,921 B1 * | 4/2007 | Savla | 341/155 |
| 7,671,777 B2 * | 3/2010 | Yamada et al. | 341/165 |
| 2002/0003487 A1 | 1/2002 | Harada et al. | |

FOREIGN PATENT DOCUMENTS

| JP | 8-107354 A | 4/1996 |
|---|---|---|
| JP | 2002-26731 A | 1/2002 |

OTHER PUBLICATIONS

A 6-bit 600-MS/s 5.3mW Asynchronous ADC in 0.13-um CMOS, S-W. M. Chen et al., IEEE JSSC, Dec. 2006 Summary.

* cited by examiner

*Primary Examiner* — Brian Young
(74) *Attorney, Agent, or Firm* — Arent Fox LLP

(57) ABSTRACT

A comparator circuit includes a first comparator comparing an input signal to a first comparison value and generating a first determination signal, a second comparator comparing the input signal to a second comparison value different from the first comparison value and generating a second determination signal, and an output selecting circuit selecting a signal generated first from the first determination signal and the second determination signal, and outputting the selected signal as a determination signal.

14 Claims, 19 Drawing Sheets

I1>>I2

I1≃I2

US 7,986,257 B2

COMPARATOR CIRCUIT AND ANALOG DIGITAL CONVERTER HAVING THE SAME

CROSS-REFERENCE TO RELATED APPLICATIONS

This application is based upon and claims the benefit of priority from the prior Japanese Patent Application No. 2008-207942, filed on Aug. 12, 2008, the entire contents of which is incorporated herein by reference.

FIELD

The present invention relates to a comparator circuit and an analog digital converter having the comparator circuit.

BACKGROUND

Comparator circuits compare two input voltages and amplify a voltage difference therebetween so as to output a comparison result signal. Particularly, latch comparator circuits, which have positive feedback circuits, perform the amplifying operation at a higher speed by means of the positive feedback circuit.

Various electronic circuits have comparator circuits. For example, an analog digital converter (ADC), which converts an analog input signal into a digital output signal, has a comparator circuit. This comparator circuit compares a sampled and held analog input voltage to a standard voltage so as to determine each bit. In a successive approximation ADC which sequentially detects a plurality of bits of the digital output signal from most significant bit (MSB) to least significant bit (LSB), the comparator circuit performs the determining operation a plurality of times. When the operating speed of the comparator circuit is slow, a converting speed of the analog-digital conversion (AD conversion) also becomes slow.

The successive approximation ADC is described in, for example, Japanese Patent Application Laid-Open No. 8-107354 and Japanese Patent Application Laid-Open No 2002-26731.

In the successive approximation ADC, a sample and hold circuit samples and holds an analog input voltage at a constant cycle, and the comparator circuit repeats a determining operation for determining whether the analog input voltage is higher or lower than a determination voltage the same number of times as the number of bits of the digital output. The successive approximation ADC is classified into a synchronous successive approximation ADC, which repeats the determining operation in a determining cycle obtained by dividing a holding cycle by the number of bits, and a nonsynchronous successive approximation ADC, which starts the determining operation on a next bit every time the determining operation on each bit is ended.

SUMMARY OF THE INVENTION

According to an aspect of the invention, a comparator circuit includes a first comparator comparing an input signal to a first comparison value and generating a first determination signal, a second comparator comparing the input signal to a second comparison value different from the first comparison value and generating a second determination signal, and an output selecting circuit selecting, from the first determination signal and the second determination signal, a signal generated first and outputting the selected signal as a determination signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE EMBODIMENTS

In a synchronous successive approximation ADC, a comparator circuit operates in constant cycle. The cycle is determined based on the time necessary for a determining operation of the comparator circuit. The determining operation of the comparator circuit requires a longer time as a voltage difference to be determined becomes smaller. A comparing cycle is set according to the time necessary for determining a small voltage difference. On the other hand, in a nonsynchronous successive approximation ADC, an operation of the comparator circuit is performed in a non-constant cycle, and when a certain determination is completed, the next determination is performed. As the voltage difference becomes larger, the determining operation of the comparator circuit is completed in a shorter time. For this reason, an analog-digital conversion (AD conversion) speed of nonsynchronous successive approximation ADC is faster than the speed of the synchronous type. In an operation of the nonsynchronous successive approximation ADC, after a determination is completed the next determination is performed. If the voltage difference becomes smaller, a determination may not be completed within a holding cycle. If the determination is not completed while determining bits during the AD conversion, the bit determination thereafter is not performed, and thus a digital output signal may include a large error. In the synchronous system, since all the bits are inevitably determined, the error is small.

In the synchronous successive approximation ADC and the nonsynchronous successive approximation ADC, since the determining time of the comparator circuit influences the AD converting speed, shortening the determining time of the comparator circuit is desirable in order to improve the AD converting speed. Particularly when amplitude of an analog signal is small due to an ADC having a high resolution and/or due to a low-power source voltage, the difference in an input voltage of the comparator circuit becomes smaller, and the determining time of the comparator circuit becomes longer.

Figure 1A:
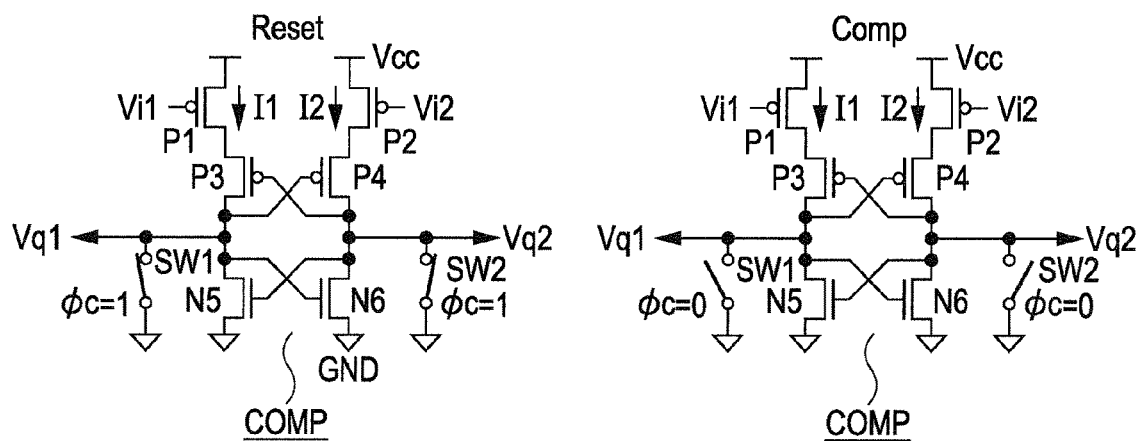
FIGS. 1A and 1B illustrate a comparator circuit and an operation of the comparator circuit.

FIG. 1A illustrates the comparator circuit. The comparator circuit COMP has a first P-channel transistor P1 and a second P-channel transistor P2. The first P-channel transistor P1 receives a first input signal Vi1 at a gate, and supplies a first electric current I1 to a first output terminal Vq1. The second P-channel transistor P2 receives a second input signal Vi2, which may be a determination value or a comparison value, at a gate, and supplies a second electric current I2 to a second output terminal Vq2. Sources of the transistors P1 and P2 are coupled to a power source Vcc. The comparator circuit has an amplifying circuit which amplifies a potential difference between the first and second output terminals according to the potential difference between the first and second output terminals Vq1 and Vq2 caused by the first and second electric currents I1 and I2. The amplifying circuit has P-channel transistors P3 and P4 and N-channel transistors N5 and N6, and functions as a latch circuit. Gates and drains of the P-channel transistors P3 and P4 are cross-coupled. Gates and drains of the N-channel transistors N5 and N6 are cross-coupled. The comparator circuit in FIG. 1A may also be called a latch comparator.

The comparator circuit has switch pairs SW1 and SW2 which are turned ON at the time of a reset operation and make the first and second output terminals have a ground potential GND. The switches SW1 and SW2 are turned ON at the time of the reset operation as illustrated on the left side of FIG. 1A, and the switches SW1 and SW2 are turned OFF at the time of a determining operation as illustrated in the right side of FIG. 1A.

Figure 1B:
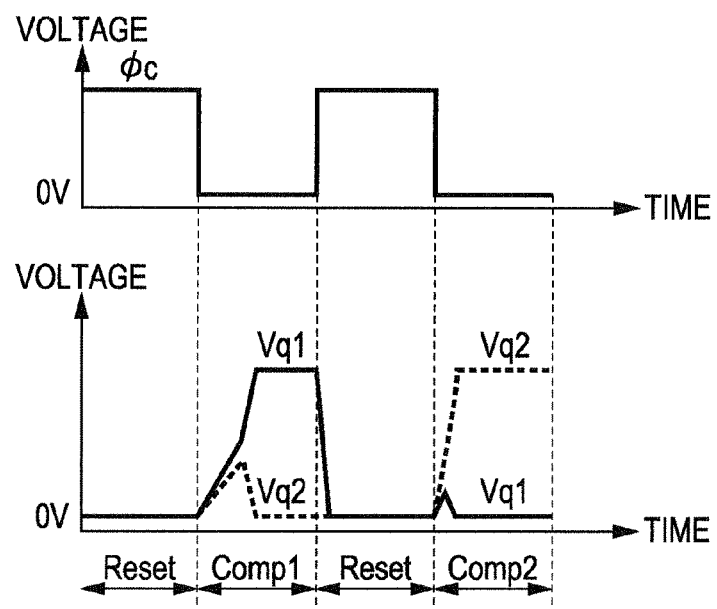

FIG. 1B illustrates the operation of the comparator circuit. A control clock Φc is brought into a high level (H level) for a reset operation period RESET, and both of the output terminals Vq1 and Vq2 have the ground potential. The control clock Φc is in a low level (L level) for a determining operation period Comp1 and Comp2, and both of the output terminals Vq1 and Vq2 are cut off from the ground potential. The transistors P1 and P2 apply the first and second electric currents I1 and I2 according to the potential difference between the input signals Vi1 and Vi2. At the time of reset, both the output terminals Vq1 and Vq2 are in the L level, namely, a ground level, and the transistors P3 and P4 are in a conductive state. As a result, the electric potentials of the output terminals Vq1 and Vq2 rise due to the first and second electric currents I1 and I2. The slope of the potential rise is proportional to the current difference between the first and second electric currents I1 and I2. When the potential difference between the output terminals Vq1 and Vq2 has a value not less than a certain value, any one of the transistors P3 and P4 is in a strong ON state, and any one of the transistors N5 and N6 is in a strong ON state. The amplifying circuit having these transistors increases the electric potentials of the output terminals Vq1 and Vq2 to a power source Vcc level, i.e., H level, or decreases to a ground level, i.e., L level, so as to latch either the H level potential or the L level potential and complete the determining operation. When the determining operation is completed, the electric potentials of the output terminals Vq1 and Vq2 become either the H level or the L level.

In the determining operation Comp1 in FIG. 1B, the potential difference between the input signals Vi1 and Vi2 is comparatively small, and a comparatively long time is required until the output terminals Vq1 and Vq2 are in the H level or the L level when the determining operation is completed. In the determining operation Comp2 of FIG. 1B, the potential difference between the input signals Vi1 and Vi2 is comparatively large, and the determining operation is completed in a comparatively short time.

Figure 2A:
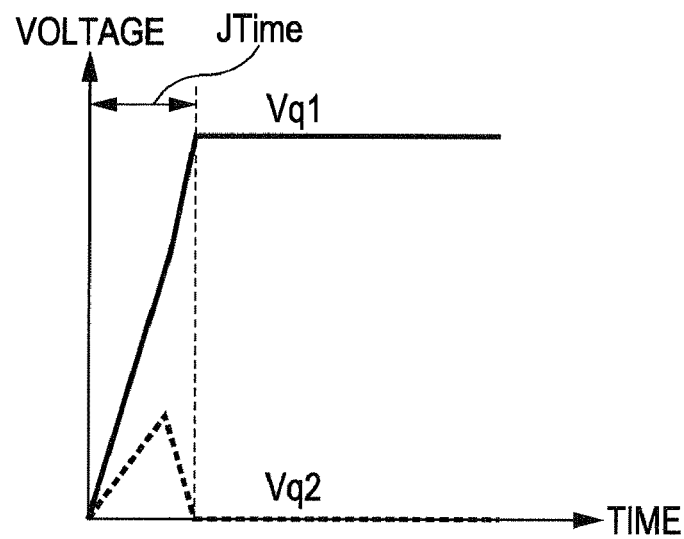
FIGS. 2A and 2B illustrate a determining operation of the comparator circuit.
Figure 2B:
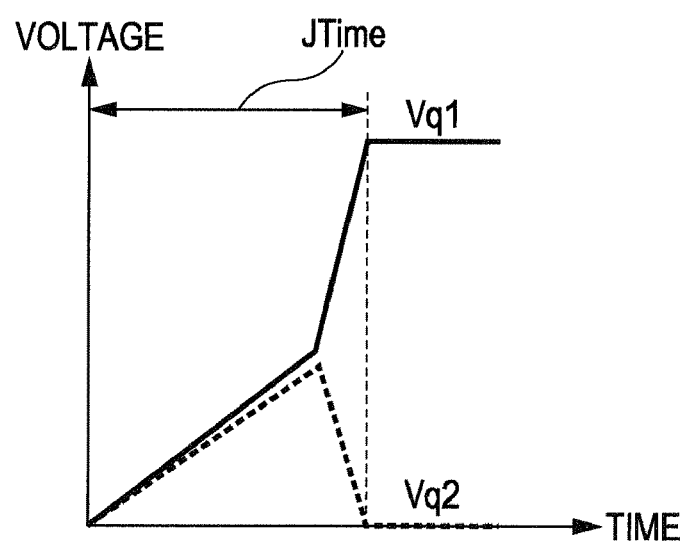

FIGS. 2A and 2B illustrate the determining operation of the comparator circuit. FIG. 2A is an example where the potential difference between the input signals Vi1 and Vi2 is large and the first electric current I1 is sufficiently higher than the second electric current I2. In this case, the potential difference between the output terminals Vq1 and Vq2 becomes large in a short time, and the voltages of the output terminals Vq1 and Vq2 are in the H level and the L level for a short determination time JTime due to the latching operation of the amplifying circuit. FIG. 2B illustrates a case where the potential difference between the input signals Vi1 and Vi2 is small, and the first and second electric currents I1 and I2 are approximately equal to each other. Since the first and second electric currents I1 and I2 are approximately equal to each other, the potential difference between the output terminals Vq1 and Vq2 takes a long time to become large, and thus a longer time is required until the latching operation of the amplifying circuit. For this reason, the determination time JTime becomes long.

In addition to the configuration illustrated in FIG. 1, a comparator circuit having a latching function may be configured so that the amplifying circuit composed of the transistors P3, P4, N5 and N6 inputs an output from a differential circuit composed of transistors P1 and P2 and amplifies the output.

Figure 3A:
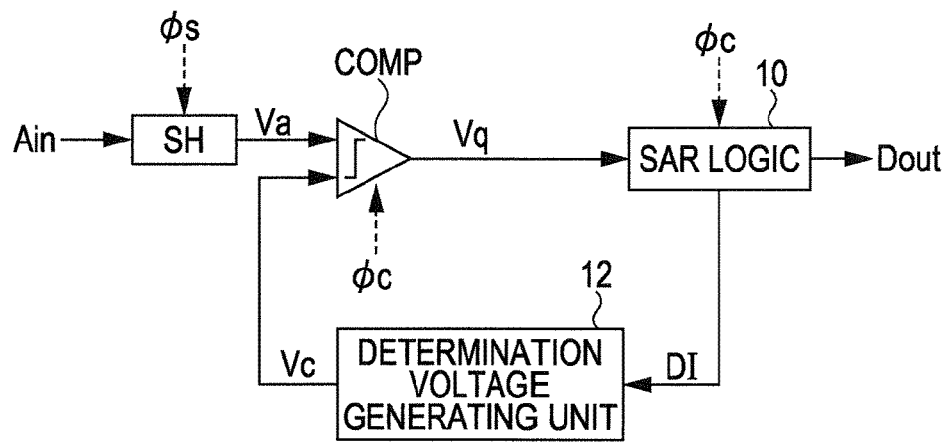
FIGS. 3A to 3C illustrate a synchronous successive approximation ADC and an operation of the same.
Figure 3B:
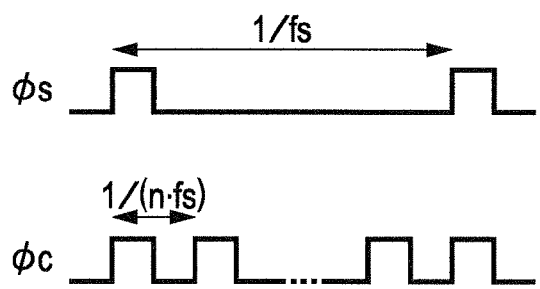
Figure 3C:
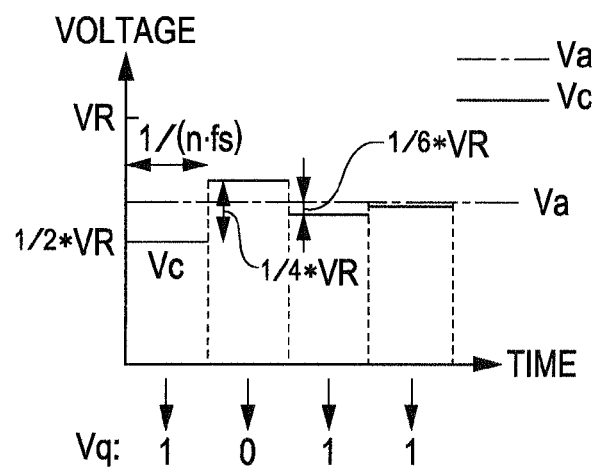

FIGS. 3A to 3C illustrate the synchronous successive approximation ADC. The synchronous successive approximation ADC of FIG. 3A has a sample and hold circuit SH and a comparator circuit COMP. The sample and hold circuit SH samples—and holds an analog input signal Ain in synchronization with a sample clock Φs. The comparator circuit COMP compares a held input voltage Va to a determination voltage Vc in synchronization with a determination clock Φc so as to generate a determination signal Vq that indicates the determined result as to whether the input voltage Va is higher or lower than the determination voltage Vc. Further, the synchronous successive approximation ADC has a successive approximation register (SAR) logic circuit 10 and a determination voltage generating unit 12. The SAR logic circuit 10 successively saves the determination signals Vq in synchronization with the determination clock Φc and outputs the determination signals Vq as digital output signals Dout. The determination voltage generating unit 12 receives a digital input signal DI generated by the SAR logic circuit 10 according to the determined result, and generates the determination voltage Vc. The SAR logic circuit 10 has a register, which successively saves the determination signals Vq, and a logic circuit, which generates the digital input signal DI. Further, the determination voltage generating unit 12 is a digital-analog converter (DAC) which converts the digital input signal DI into the analog determination voltage Vc.

FIG. 3B illustrates a relationship between the sample clock Φs and the determination clock Φc. The sample clock Φs is generated in a cycle 1/fs which is an inverse number of a sample frequency fs, and the sample and hold circuit SH samples and holds the analog input signal Ain in synchronization with the sample clock Φs. The determination clock Φc is generated in a cycle 1/nfs which is an inverse number of a frequency nfs n-times larger than the sample frequency fs. The cycle or the frequency of the determination clock Φc depends on the number of bits n of the digital output signal Dout and the sample clock Φs.

As illustrated in FIG. 3C, the determination voltage generating unit 12 generates the determination voltage Vc in synchronization with the determination clock Φc, and the comparator circuit COMP determines whether the input voltage Va is higher or lower than the determination voltage Vc so as to generate a determination signal Vq="1011". The SAR logic circuit 10 generates a digital input signal DI according to the determined results of the respective bits, and the determination voltage generating unit 12 changes the determination voltage Vc into VR/2, 3VR/4, or 5VR/8 based on the digital input signal DI. When the determination of all the n bits is completed, the SAR logic circuit 10 outputs a digital output signal Dout made up of n bits. VR here is a full-scale voltage of an AD conversion.

The synchronous successive approximation ADC performs the converting operation in synchronization with the determination clock Φc and the sample clock Φs. The determination clock Φc and the sample clock Φs are set based on the longest determination time of the comparator circuit COMP. When the determination time of the comparator circuit is short, the converting time of the ADC may be shortened.

Figure 4A:
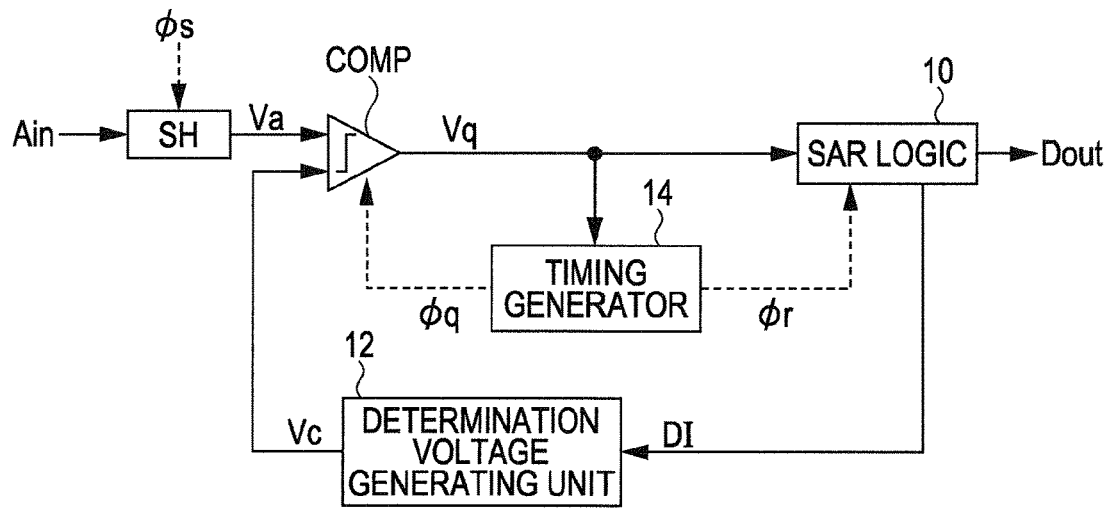
FIGS. 4A to 4C illustrate a nonsynchronous successive approximation ADC and an operation of the same.

FIG. 4A illustrates the nonsynchronous successive approximation ADC. As in the synchronous successive approximation ADC in FIG. 3A, the nonsynchronous successive approximation ADC has the sample and hold circuit SH, the comparator circuit COMP, the SAR logic circuit 10, and the determination voltage generating unit 12. Unlike the synchronous successive approximation ADC in FIG. 4A, a timing generator 14 responds to the determination signal Vq generated upon the completion of the determination in the comparator circuit COMP so as to generate a determination clock Φq. The nonsynchronous ADC is an event-driven type that determines the number of bits and responds to an event representing the completion of the bit determination in the comparator circuit so as to generate the next determination clock Φc.

Figure 4B:
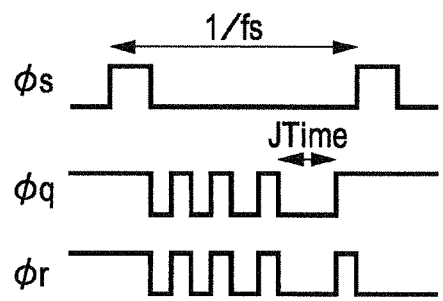
Figure 4C:
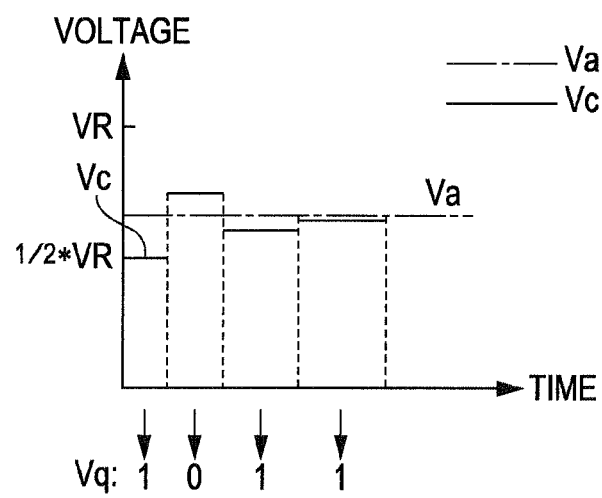

FIG. 4B illustrates the relationship between the sample clock Φs and the determination clock Φq in the nonsynchronous successive approximation ADC in FIG. 4A. Similar to FIG. 3B, the sample clock Φs is generated in a cycle 1/fs, which is an inverse number of the sample frequency fs, and the sample and hold circuit SH samples and holds the analog input signal Ain in synchronization with the sample clock Φs. The determination clock Φq has an L-level period depending on the bit determination time JTime. The bit determination time JTime is short for higher-order bits and becomes longer for lower-order bits.

The nonsynchronous successive approximation ADC in FIG. 4A desirably completes the determination on N bits within the cycle 1/fs of the sample clock Φs. In some cases, the determination of bits is not completed within the holding cycle due to a voltage value of the analog input signal Ain, and thus an initial value not more than a certain bit of the register in the SAR logic circuit 10 is output directly. In this case, accuracy of the digital output signal Dout deteriorates. Therefore, even in the nonsynchronous successive approximation ADC, reducing the determination time of the comparator circuit is desired.

Figure 5:
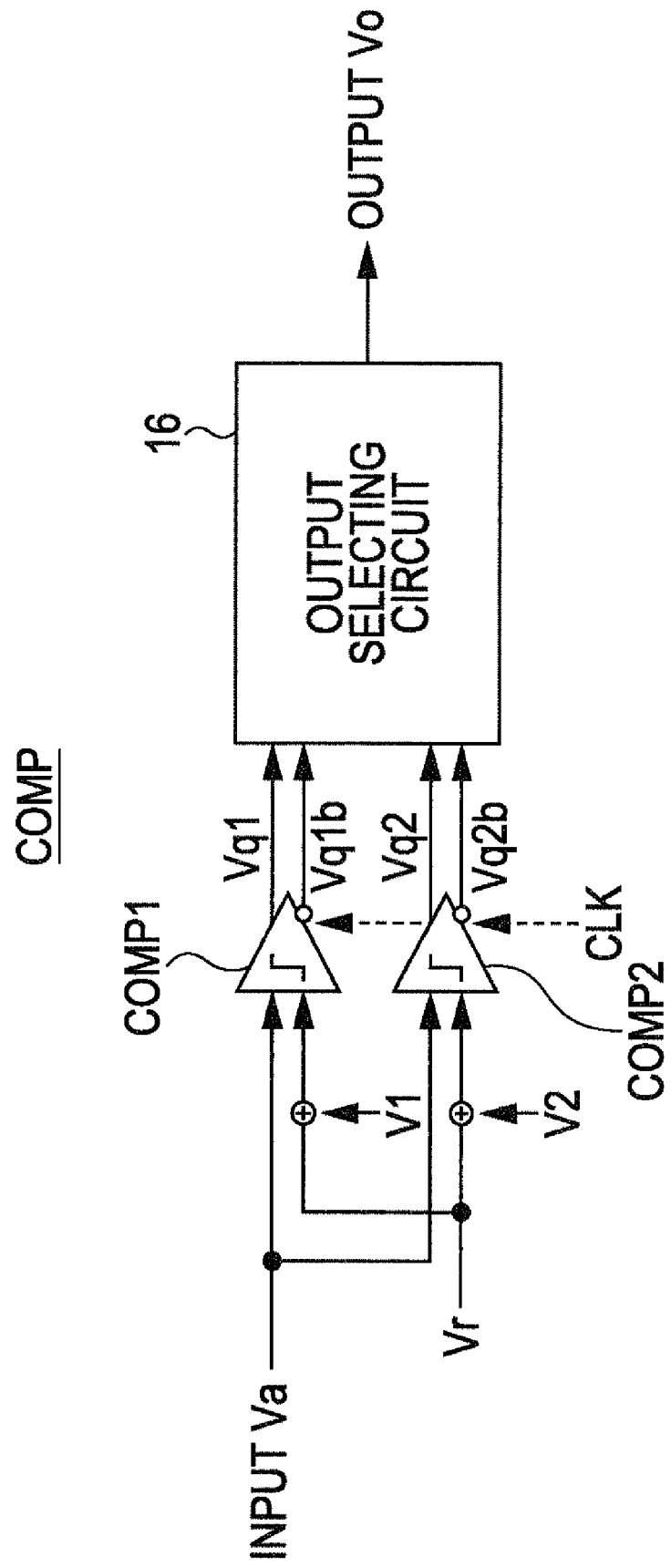
FIG. 5 illustrates the comparator circuit according to one embodiment of the present invention.

FIG. 5 illustrates the comparator circuit according to one embodiment of the present invention. The comparator circuit COMP outputs a determination signal Vo indicating whether the input signal Va is higher or lower than the determination value Vr. The comparator circuit has a first comparator COMP1, a second comparator COMP2, and an output selecting circuit 16. The first comparator COMP1 compares the voltage value of the input signal Va to a first comparison value Vr+V1 so as to generate first determination signals Vq1 and Vq1b having the determined results. The second comparator COMP2 compares the input signal Va with a second comparison value Vr+V2, which is different from the first comparison value, so as to generate second determination signals Vq2 and Vq2b having the determined results. The output selecting circuit 16 detects which one of the first determination signal and the second determination signal is generated first, and selects the signal generated first so as to output it as the determination signal Vo.

Figure 6A:
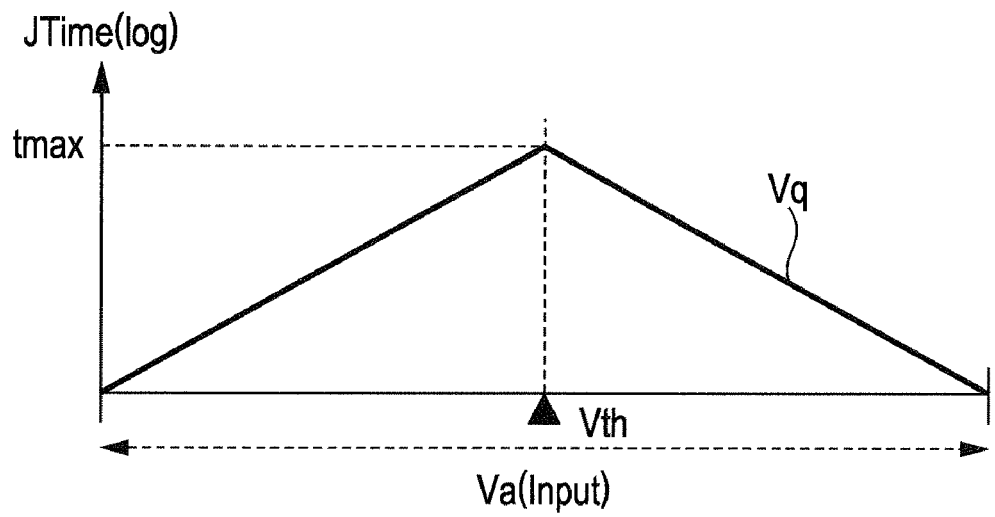
FIGS. 6A and 6B illustrate an operation of the comparator circuit in FIG. 5.

FIG. 6A illustrates the determination time JTime according to the comparison of the input voltage Vi1 and the determination value of the input voltage Vi2 in the comparator circuit illustrated in FIG. 1. The input voltage Vi1 is plotted along the abscissa axis, and the determination time JTime is plotted along the ordinate axis. When the input voltage Vi1 is sufficiently lower or higher than the determination value Vi2, the determination time JTime is short, and, as the input voltage Vi1 approaches the determination value Vi2, the determination time JTime becomes longer.

Figure 6B:
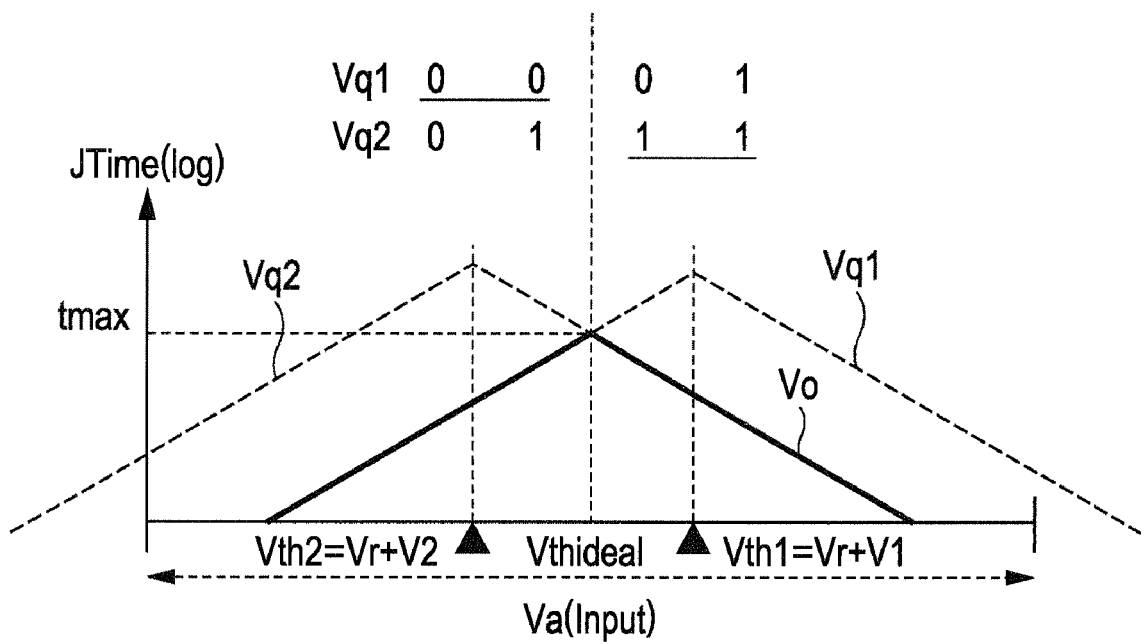

FIG. 6B illustrates the determination time JTime of the comparator circuit in FIG. 5. The comparator circuit in FIG. 5 has first and second comparators COMP1 and COMP2 which compare the input voltage Va to the comparison values Vth1 and Vth2. Vth1 is obtained by adding V1 to Vr, and Vth2 is obtained by adding V2 to Vr. The determination times JTime required for the first and second comparators COMP1 and COMP2 to generate the first and second determination signals Vq1 and Vq2 are indicated by dashed lines in FIG. 6B. The output selecting circuit 16 selects one of the first and second determination signals Vq1 and Vq2 which is generated first so as to output the firstly generated determination signal as the determination signal Vo.

In FIG. 6B, when the input voltage Va is lower than the first comparison value Vth1, the first determination signal Vq1 becomes "0." When the input voltage Va is higher than the first comparison value Vth1, the first determination signal Vq1 becomes "1". When the input voltage Va is lower than the second comparison value Vth2, the second determination signal Vq2 becomes "0." When the input voltage Va is higher than the second comparison value Vth2, the second determination signal Vq2 becomes "1". The output selecting circuit 16 selects one of the determination signals Vq1 and Vq2 whose determination time JTime is shorter so as to output the firstly generated determination signal as a determination signal Vo. As a result, the determined result of the determination signal Vo becomes "0" or "1" as indicated by underlines, with the boundary being an ideal determination value Vthideal of a middle point between the first and second comparison values Vth1 and Vth2. The determination time JTime of the determination signal Vo becomes shorter than the determination times of the first and second determination signals Vq1 and Vq2 as indicated by the thick line in FIG. 6B.

In order to determine the input voltage Va based on the ideal determination value Vthideal in the comparator circuit, it is desirable that Vr=Vthideal and V1=−V2. That is to say, when Vth1=Vr+dV and Vth2=Vr−dV, as illustrated in FIG. 6B, the comparator circuit generates the determination signal Qo based on the ideal determination value Vthideal.

In FIG. 5, the first and second comparison values Vth1 and Vth2 are generated by an adder. In another method, the same determination value Vr is given as a comparison value to both the comparators COMP1 and COMP2, and the size of the transistor P1 of the comparator COMP1 is set to be larger than the size of P2, and the size of the transistor P1 of the comparator COMP2 is set to be smaller than P2. In such a manner, the determination levels of both the comparators COMP1 and COMP2 may be substantially different from each other.

Figure 7:
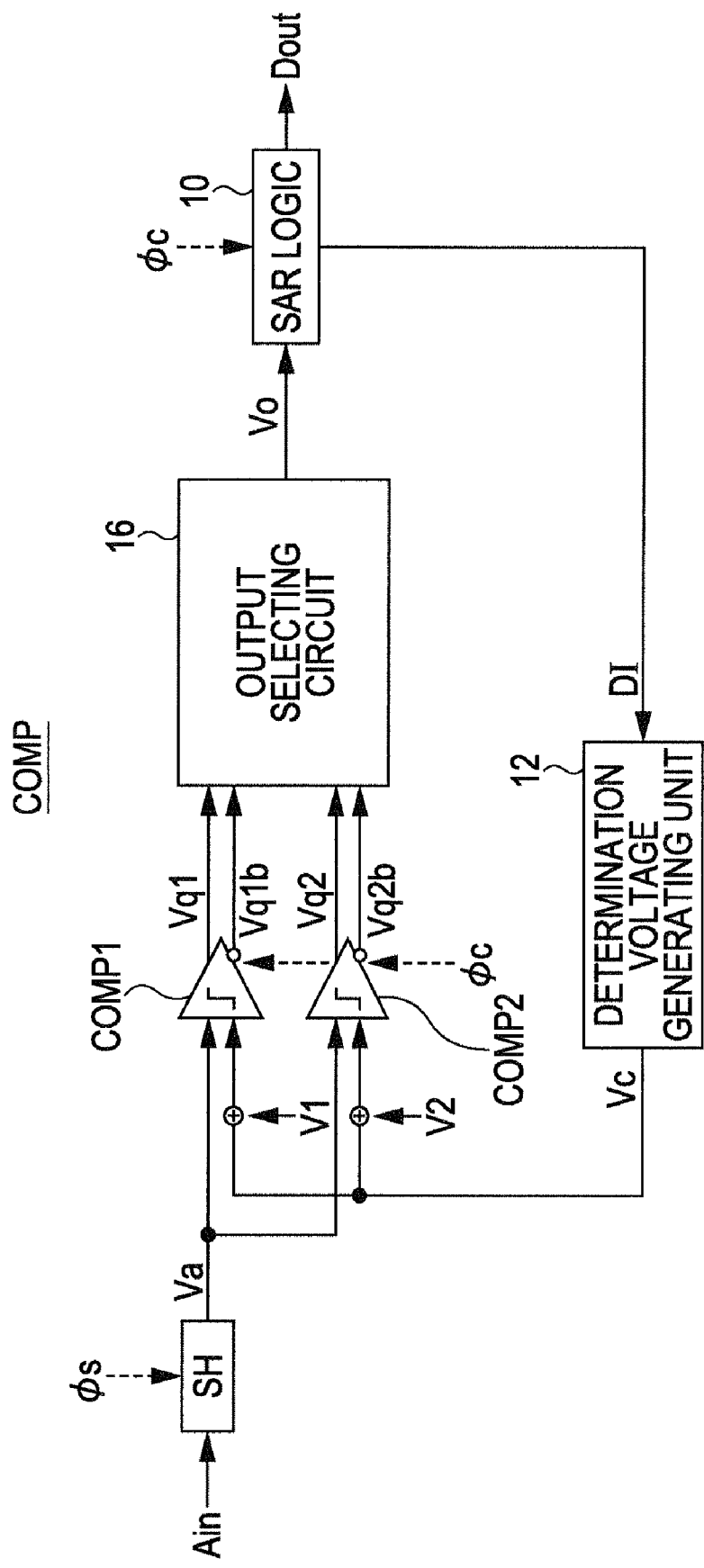
FIG. 7 illustrates the synchronous successive approximation ADC according to one embodiment of the present invention.

FIG. 7 illustrates the synchronous successive approximation ADC according to one embodiment of the present invention. The comparator circuit COMP has the two comparators COMP1 and COMP2, and the output selecting circuit 16. The output selecting circuit 16 selects and outputs the signals generated first from the determination signals Vq1 and Vq1*b* and the determination signals Vq2 and Vq2*b*. In the synchronous successive approximation ADC, the two comparators COMP1 and COMP2 compare and determine the input voltage Va based on different comparison voltages in synchronization with the determination clock Φc.

Figure 8:
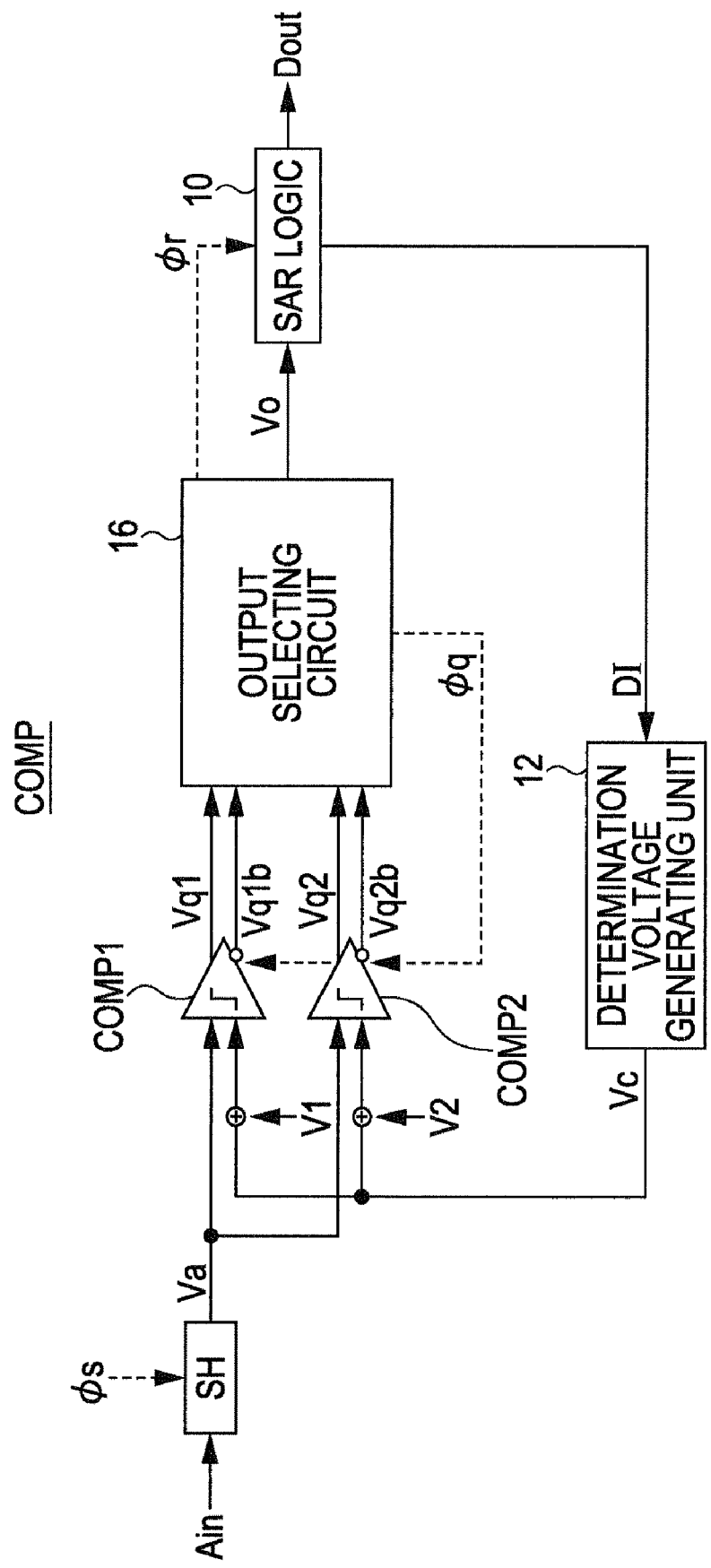
FIG. 8 illustrates the nonsynchronous successive approximation ADC according to one embodiment of the present invention.

FIG. 8 is a diagram illustrating the nonsynchronous successive approximation ADC according to one embodiment of the present invention. In the nonsynchronous successive approximation ADC, the comparator circuit COMP has the two comparators COMP1 and COMP2, and the output selecting circuit 16. The output selecting circuit 16 selects and outputs the signals generated first from the determination signals Vq1 and Vq1*b* and from Vq2 and Vq2*b*.

In the nonsynchronous successive approximation ADC of FIG. 8, the output selecting circuit 16 supplies a determination clock Φq to both the comparators COMP1 and COMP2 upon outputting the determination signal Vo. The output selecting circuit 16 outputs a control signal Φr for inputting the determination signal Vo for the SAR logic circuit 10, and outputs the determination clock Φq.

In FIG. 8, since the determination time JTime of the comparator circuit COMP may be shortened, the ADC conversion time also becomes shorter by the same amount. The ADC is able to complete the operation for determining n bits within the cycle of the sample clock Φs which may heighten the accuracy of the digital output signal Dout.

Figure 9:
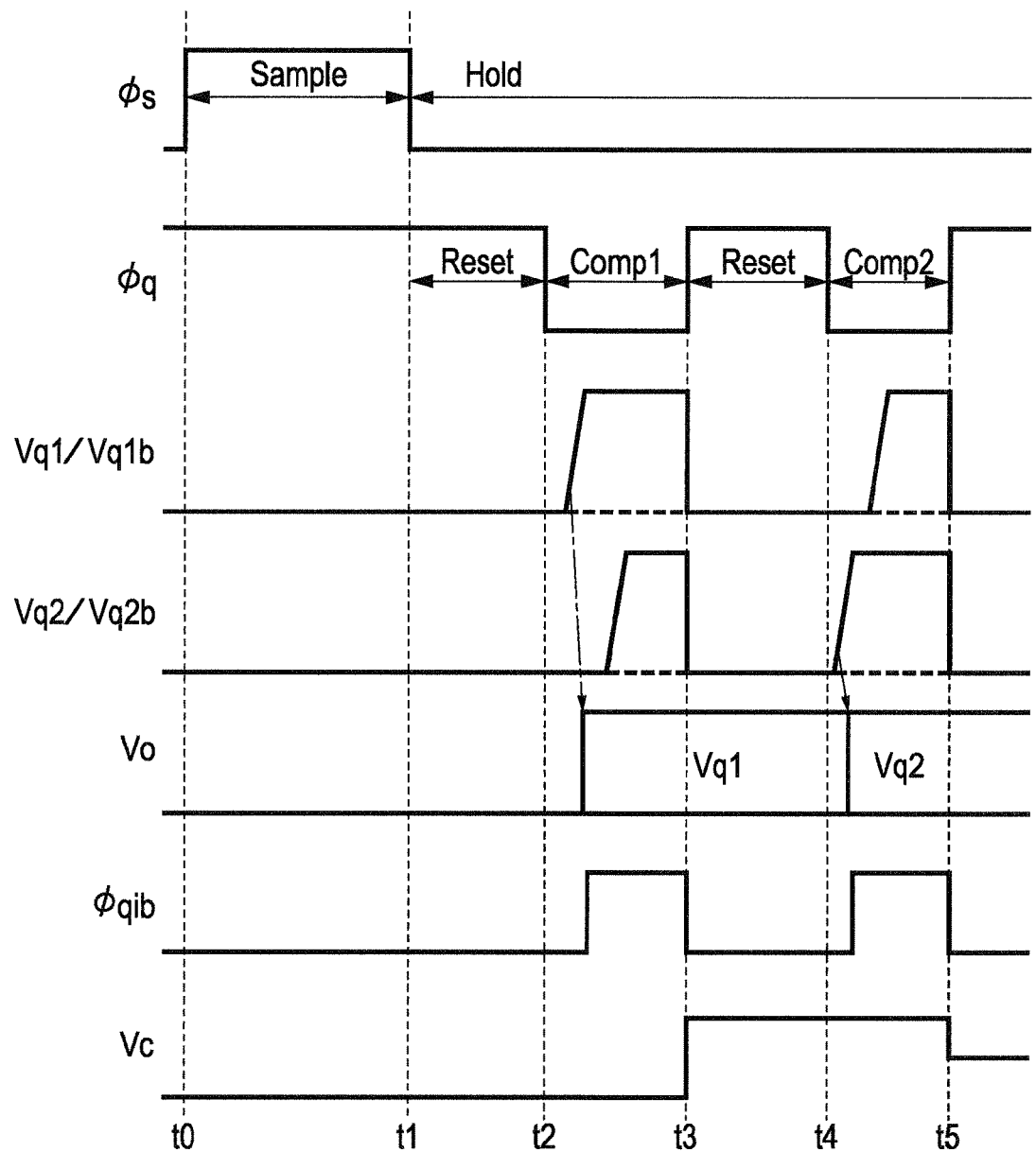
FIG. 9 is a timing waveform chart illustrating the operation of the nonsynchronous successive approximation ADC in FIG. 8.

FIG. 9 illustrates the operation of the nonsynchronous successive approximation ADC of FIG. 8. The sample clock Φs is in the H level at time t0, and in response to this, the sample and hold circuit SH samples the analog input signal Ain. The comparator circuit COMP repeats the operation for determining the input voltage Va held by the comparator circuit COMP and a determination value the same number of times as the bit number for the holding period starting from time t1.

The determination clock Φq is in the H level at time t1, and the two comparators COMP1 and COMP2 perform the reset operation. The determination clock Φq is in the L level at time t2, and the two comparators COMP1 and COMP2 perform the determining operation. In this example, the first determination signals Vq1 and Vq1*b* are in the high level or the low level earlier than the second determination signals Vq2 and Vq2*b*. The output selecting circuit 16 selects and outputs the first determination signal Vq1 as the determination signal Vo.

The output selecting circuit 16 generates a control clock Φqib in synchronization with the output of the determination signal Vo, and after a certain time, brings the determination clock Φq into the H level. As a result, the comparators COMP1 and COMP2 perform the reset operation from time t3. While the comparators COMP1 and COMP2 are performing the reset operation, the SAR logic circuit 10 outputs the digital input signal DI according to the determined signal Vo so as to change the determination voltage Vc of a determination voltage generating unit 12.

The determination clock Φq is in the L level at time t4, and both the comparators COMP1 and COMP2 perform the determining operation. The second determination signals Vq2 and Vq2*b* are in the H level or the L level earlier than the first determination signals Vq1 and Vq1*b*. For this reason, the output selecting circuit 16 selects and outputs the second determination signal Vq2 as the determination signal Vo.

The output selecting circuit 16 generates a control clock Φqib in synchronization with the output of the determination signal Vo, and brings the determination clock Φq into the H level after a certain time. As a result, the comparators COMP1 and COMP2 perform the reset operation from time t5. While the comparators COMP1 and COMP2 are performing the reset operation, the SAR logic circuit 10 outputs a digital input signal DI according to the determination signal Vo, and changes the determination voltage Vc of the determination voltage generating unit 12. Thereafter, the bit determining operation is repeated in the same way.

Figure 10:
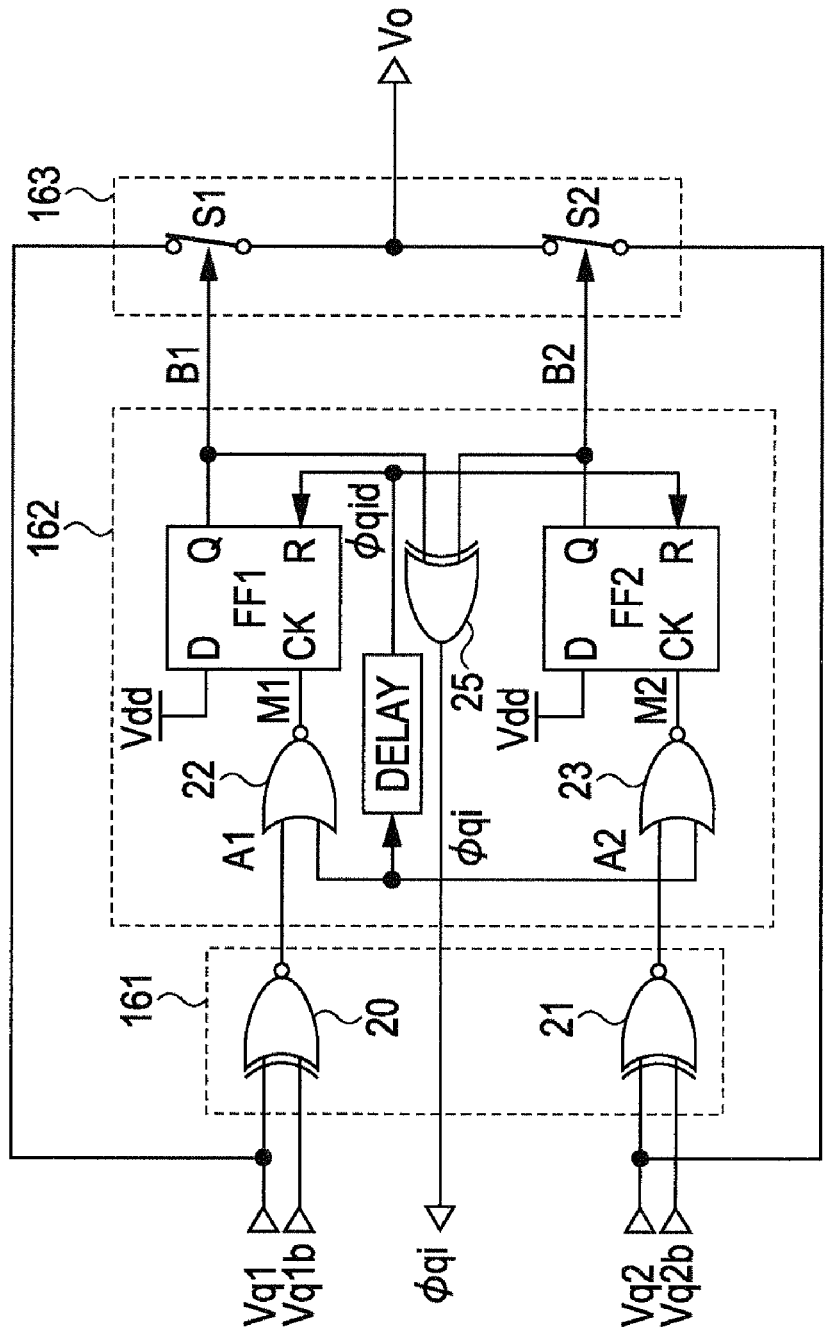
FIG. 10 illustrates one example of an output selecting circuit of the successive approximation ADC in FIG. 8.

FIG. 10 illustrates one example of the output selecting circuit 16 in FIG. 8. The output selecting circuit 16 has a determination completion detecting section 161, a determination completion order detecting section 162, and an output selecting section 163. The determination completion detecting section 161 detects whether the determination signals Vq1 and Vq1*b*, and the determination signals Vq2 and Vq2*b* of the difference of the two comparators COMP1 and COMP2 are in the H level or the L level respectively, or in the L level and the H level respectively. The determination completion order detecting section 162 detects the order of completion of the determination of the determination signals. The output selecting section 163 selects the determination signals Vq1 and Vq2 whose determination was completed first.

The determination completion detecting section 161 has a first ENOR gate 20 into which the first determination signals Vq1 and Vq1*b* are input, and a second ENOR gate 21 into which the second determination signals Vq2 and Vq2*b* are input. The ENOR circuits output L level signals when either of the differential determination signals are in the H level or the L level, or in the L level or the H level. The determination completion order detecting unit 162 has flip-flops FF1 and FF2. The output selecting section 163 has two switches S1 and S2.

Figure 11:
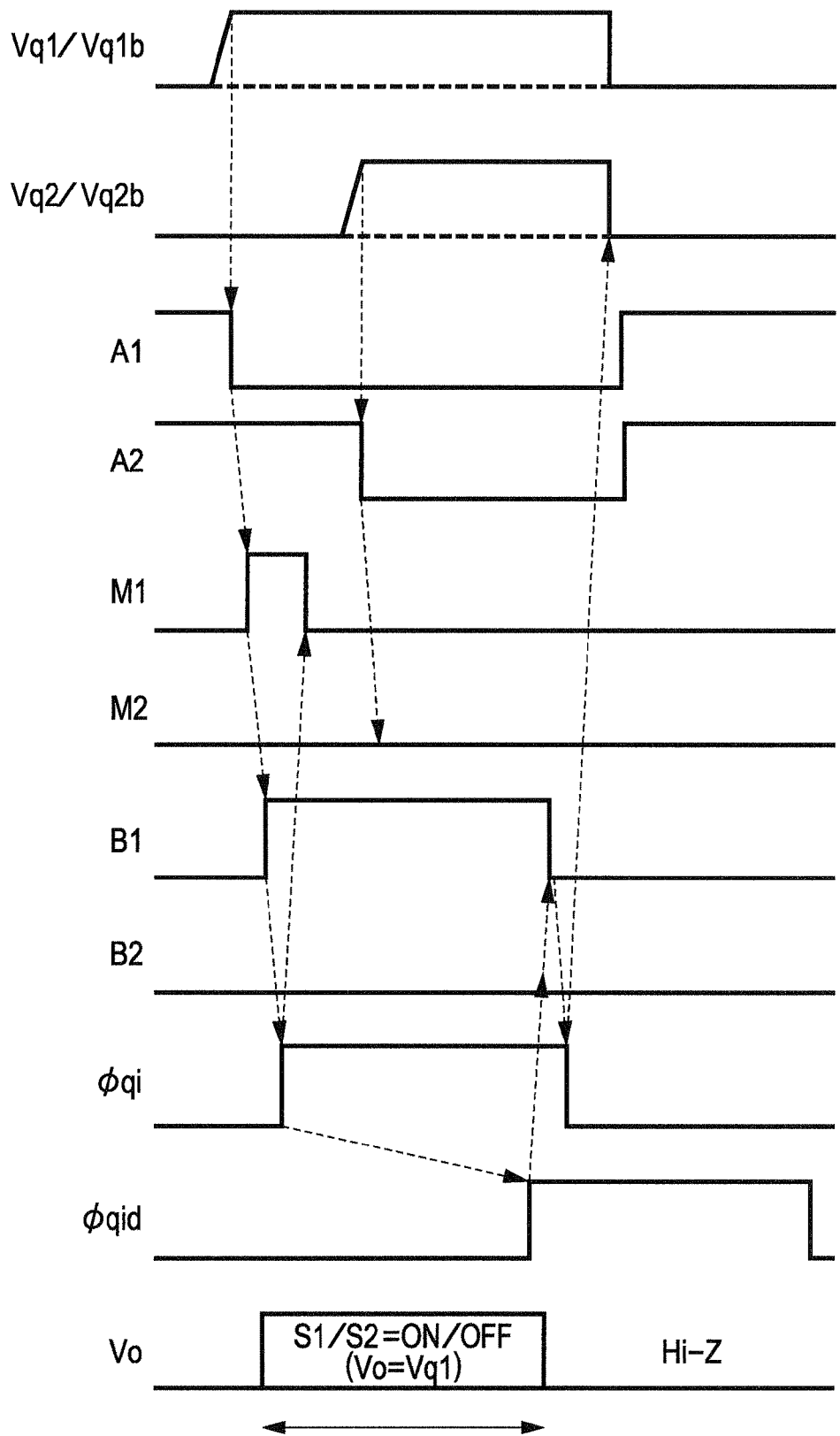
FIG. 11 is a timing waveform chart illustrating an operation of the output selecting circuit in FIG. 10.

FIG. 11 is a timing waveform chart illustrating the operation of the output selecting circuit 16 in FIG. 10.

In a state where the comparators are reset, the first and second determination signals Vq1, Vq1*b* and Vq2, Vq2*b* are in the L level, and the outputs A1 and A2 from the ENOR gates 20 and 21 are in the H level. For this reason, both the outputs M1 and M2 from the NOR gates 22 and 23 are in the L level. The flop-flops FF1 and FF2 are in the reset state, and outputs B1 and B2 are in the L level. Therefore, the output Vo is in a high-impedance state, and the control signal Φqi, which is output from a NOR gate 25, is in the L level.

In FIG. 11, the determination of the first comparator is completed first, and the determination signals Vq1 and Vq1b are in the H level and the L level respectively, or the L level and the H level respectively first. The output from the ENOR gate 20 is in the L level, and the output M1 from the NOR gate 22 is in the H level. The flop-flop FF1 captures a power source Vdd in the H level and brings the output Q (B1) into the H level. As a result, the switch S1 is turned on, and the first determination signal Vq1 is selected so as to be the output Vo. Inputs of the EOR gate 25 are in the H level and the L level, the control signal Φqi is in the H level, and the outputs from the NOR gates 22 and 23 are fixed to the L level. Even if the second determination signals vq2 and Vq2b thereafter are in the H level and the L level, the second determination signals vq2 and Vq2b are not transmitted to the flip-flop FF2. After a delay due to a delay circuit DELAY, the control signal Φqid is in the H level, both the flop-flops FF1 and FF2 are reset, the signals B1 and B2 are in the L level, the switches S1 and S2 are in the OFF state, and the output Vo is in the high-impedance state. The output Φqi from the EOR gate 25 is again in the L level.

The control signal Φqi is inverted and delayed to be the control signal Φq, and as illustrated in FIG. 8, the comparators COMP1 and COMP2 are reset. As a result, the outputs A1 and A2 from the ENOR gates 20 and 21 are in the H level.

Figure 12:
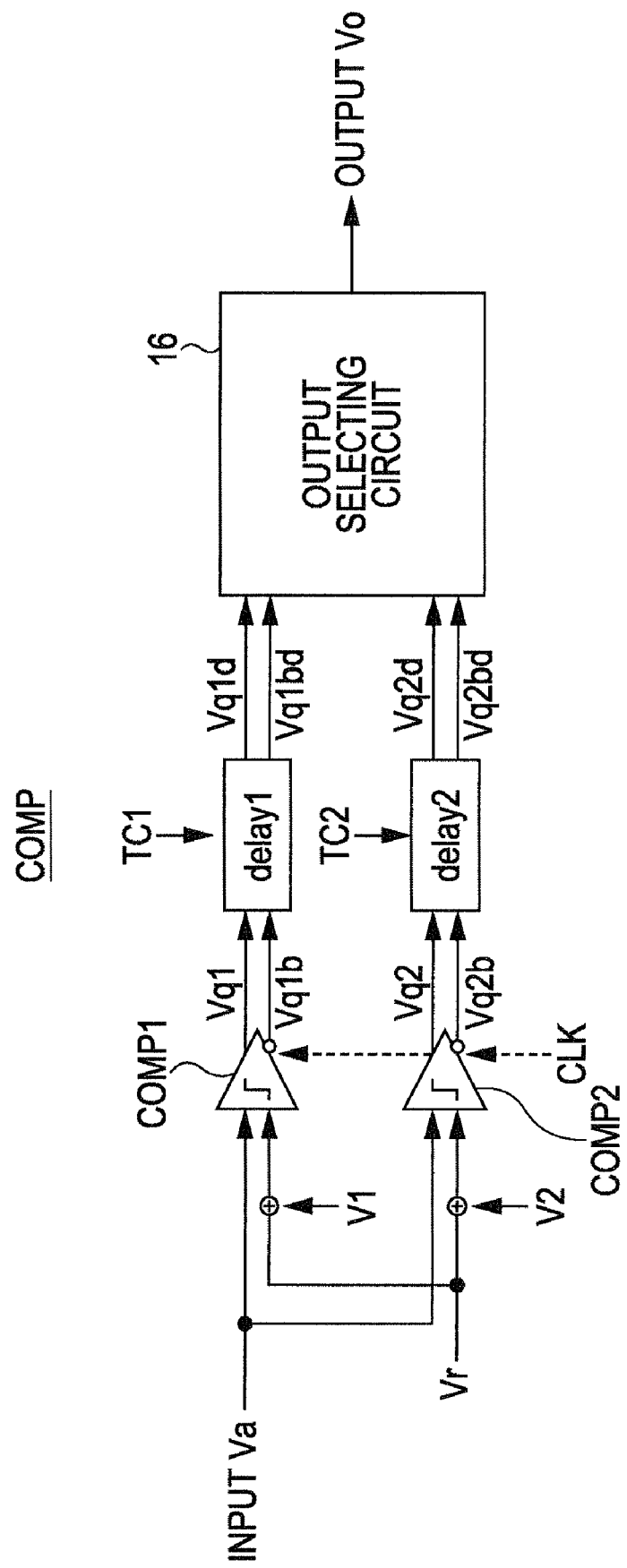
FIG. 12 illustrates a comparator circuit according to another embodiment of the present invention.

FIG. 12 illustrates the comparator circuit according to another embodiment of the present invention. The comparator circuit COMP has the first and second comparators COMP1 and COMP2, first and second delay circuits delay1 and delay2, and the output selecting circuit 16. The first and second delay circuits delay1 and delay2 delay the determination signals Vq1 and Vq1b and the determination signals Vq2 and Vq2b of the comparators COMP1 and COMP2. The output selecting circuit 16 selects the delay determination signals which are in a level that first indicates the determined result from among the delay determination signals Vq1d and Vq1bd and the delay determination signals Vq2d and Vq2bd delayed by the delay circuit, and outputs the selected delay determination signals as the determination output Vo.

The delay circuits delay1 and delay2 are provided, and delay times of the delay circuits are adjusted by delay control signals TC1 and TC2 so that offset characteristics of the comparators COMP1 and COMP2 are corrected. As a result, the comparator circuit COMP outputs the result of comparing the input value Va with the ideal determination value. Further, the determination value of the comparator circuit COMP may be set to any value regardless of the values of the comparison values Vr+V1 and Vr+V2 of the comparators COMP1 and COMP2.

Figure 13A:
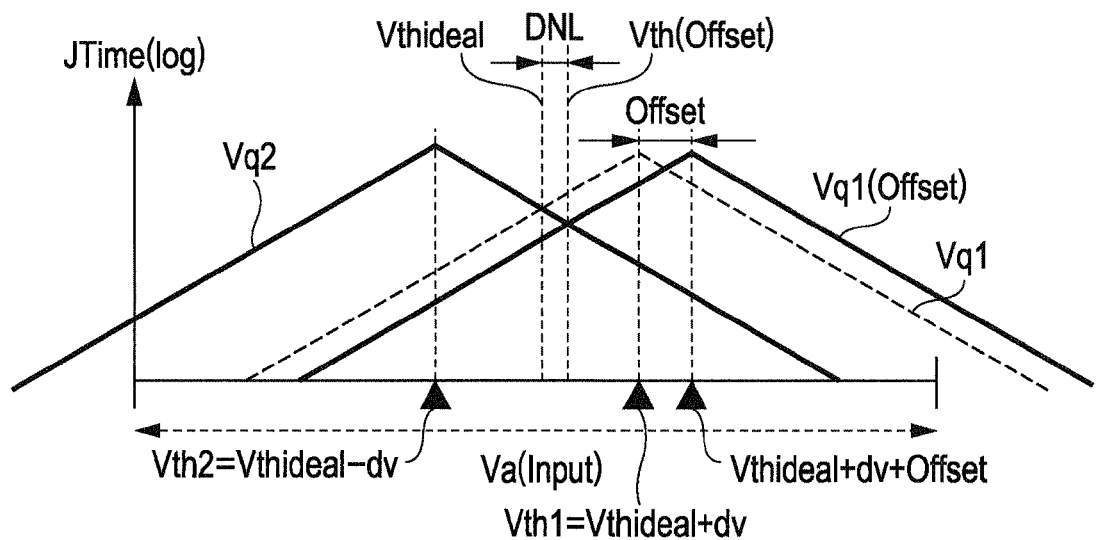
FIGS. 13A and 13B illustrate operation examples of the comparator circuit in FIG. 12.
Figure 13B:
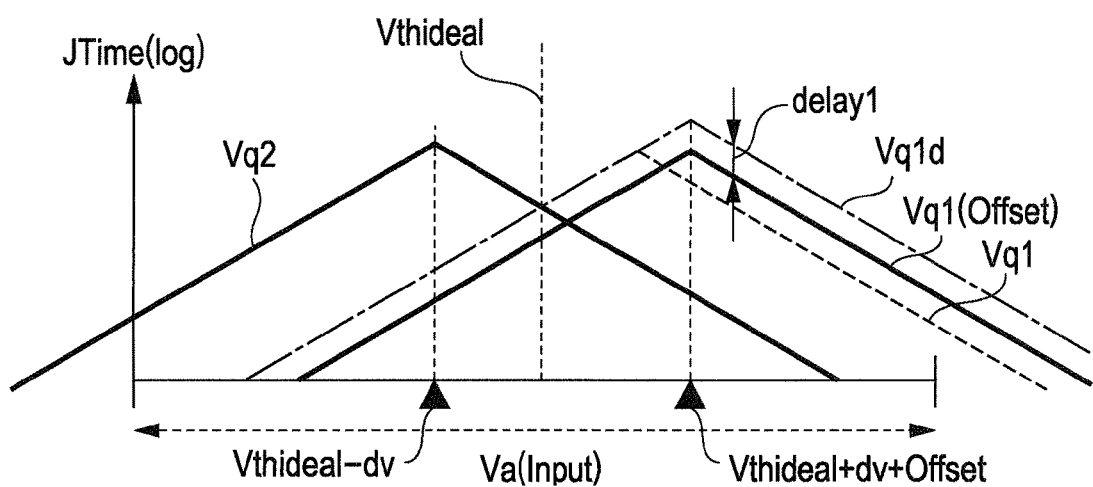

FIGS. 13A and 13B are diagrams illustrating the operation of the comparator circuit in FIG. 12. In FIG. 13A, when Vthideal+dV and Vthideal−dV are input as the comparison values of the first and second comparators COMP1 and COMP2, the comparator circuit COMP determines the input voltage Va based on the ideal determination value Vthideal as the intermediate value of the comparison values.

When the first comparator COMP1 includes an offset, the determination signal of the first comparator COMP1 is Vq1 (Offset). As a result, since the comparator circuit COMP selects and outputs the determination signals indicated by Vq1 (offset) and Vq2 whose determination time is shorter, the determination level Vth (Offset) becomes an intermediate value between Vthideal+dV+Offset and Vthideal−dV, and thus shifts away from the ideal determination value Vthideal. Such a shift causes Differential Non-Linearity (DNL) when the comparator COMP is used in the ADC.

The delay time of the delay circuit delay1 in FIG. 12 is adjusted, and the substantial determination time of the delayed first determination signal Vq1d is set to be longer than the determination time of the second determination signal Vq2. As a result, as illustrated in FIG. 13B, the determination times JTime indicated by Vq1d and Vq2 cross at the ideal determination value Vthideal. That is to say, when the delay amount of the delay circuits delay1 and delay2 is adjusted, the offsets of the comparators COMP1 and COMP2 are corrected, so that the determination value of the comparator circuit COMP may be corrected to the ideal value Vthideal.

Figure 14A:
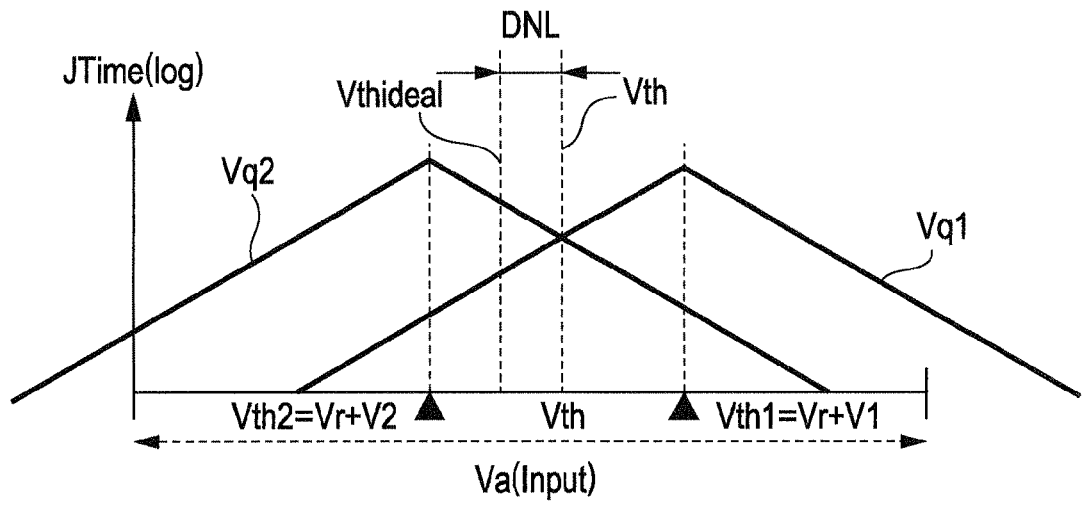
FIGS. 14A and 14B illustrate other operation examples of the comparator circuits in FIG. 12.
Figure 14B:
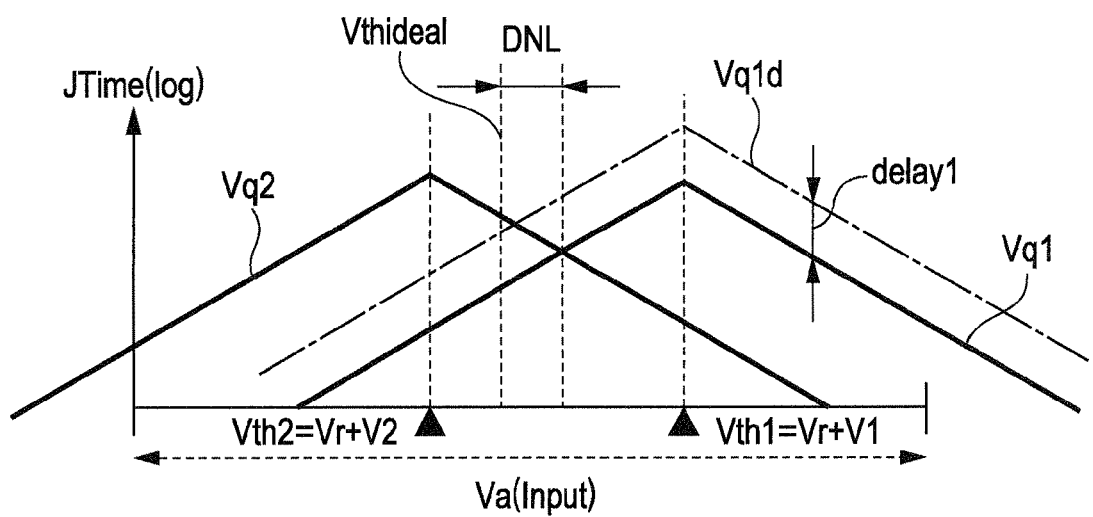

FIGS. 14A and 14B are operational diagrams of the comparator circuit in FIG. 12. As illustrated in FIG. 14A, the comparison value Vth1 of the first comparator COMP1 is set to Vr+V1, and the comparison value Vth2 of the second comparator COMP2 is set to Vr+V2. As a result, when neither of the comparators COMP1 and COMP2 have offsets, the determination value of the comparator circuit COMP is an intermediate value Vth of both of the comparison values. When the intermediate value Vth shifts from the ideal determination value Vthideal, DNL is caused as is depicted in FIG. 13.

As illustrated in FIG. 14B, the delay time of the delay circuit delay1 in FIG. 12 is adjusted, and the determination time JTime of the delayed first determination signal Vq1d is adjusted to be longer. As a result, the cross point of the determination times indicated by Vq1d and Vq2 matches the ideal determination value Vthideal. Even when the comparison values of the first and second comparators COMP1 and COMP2 are set to any value, the delay times of the delay circuits are adjusted so that the determination values of the comparators may be set to ideal values.

A method for adjusting to the ideal determination values Vthideal illustrated in the operation diagrams of FIGS. 13 and 14 is as follows. In FIG. 12, the ideal determination value Vthideal is input as the input voltage Va, and the delay times of the delay circuits delay1 and delay2 are adjusted by the delay control signals TC1 and TC2 so that the determination completion times of the first and second delayed delay determination signals Vq1d, Vq1bd, Vq2d and Vq2bd match.

Figure 15:
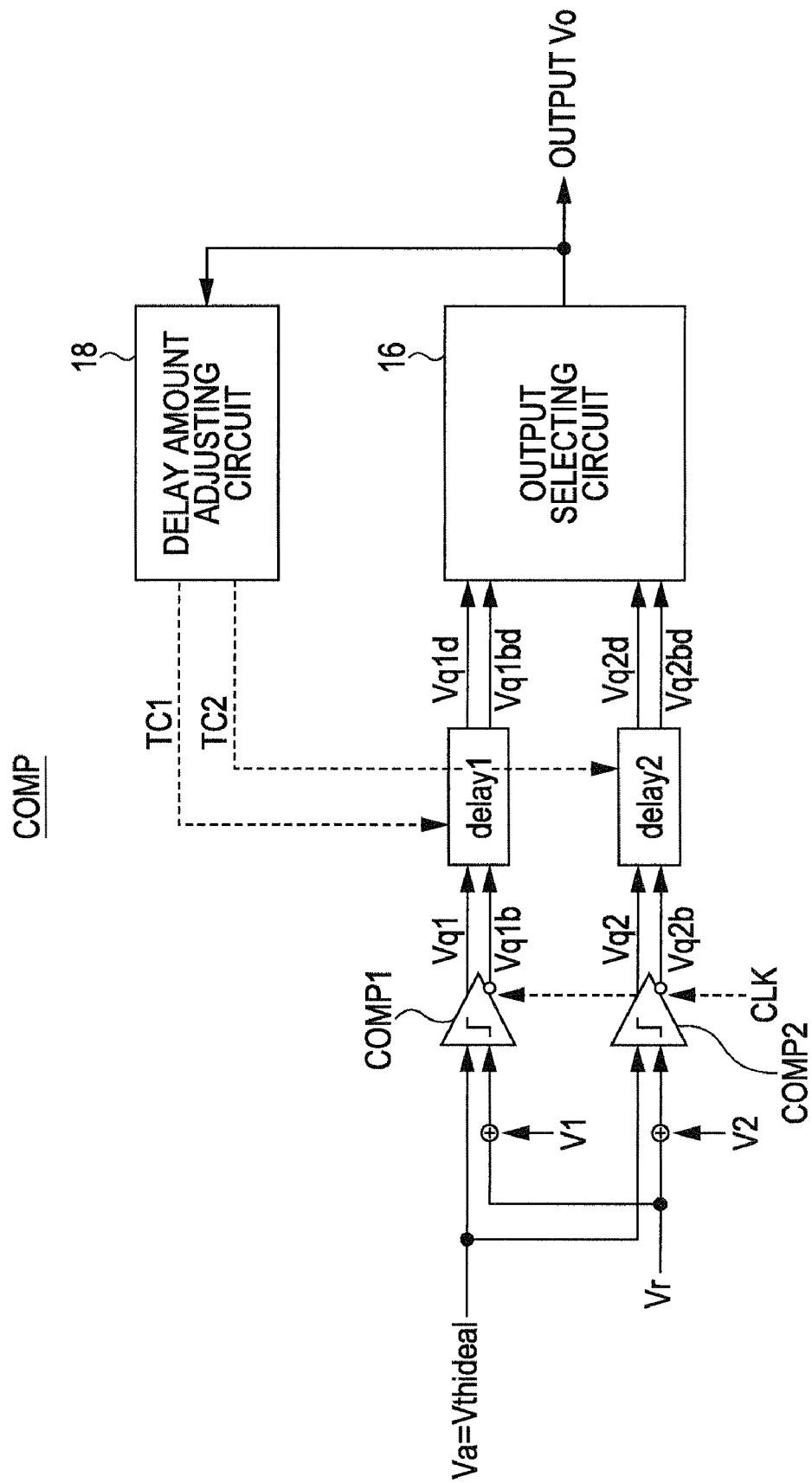
FIG. 15 illustrates another example of the comparator circuit according to another embodiment of the present invention.

FIG. 15 illustrates the comparator circuit according to another embodiment of the present invention. A delay amount adjusting circuit 18, which adjusts the delay control signals TC1 and TC2 based on the output Vo from the output selecting circuit 16, is provided. Other parts of this comparator circuit are similar to those in FIG. 12. The delay amount adjusting circuit 18 automatically adjusts the delay control signals TC1 and TC2, and corrects the determination value of the comparator circuit COMP so that the determination value matches the ideal value Vthideal. In the example of FIG. 12, the delay control signals TC1 and TC2 may be supplied from an external circuit such as a test device.

Figure 16:
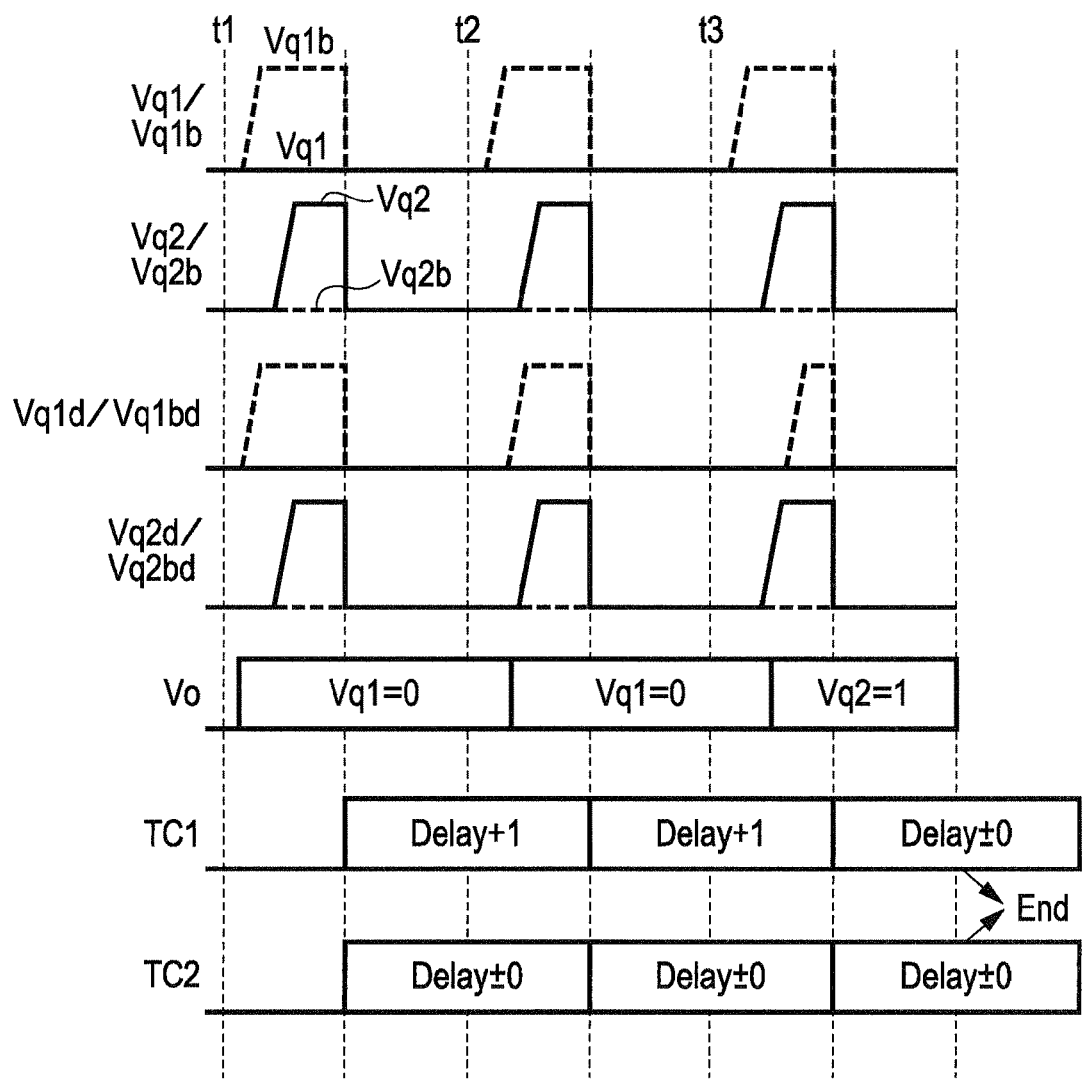
FIG. 16 illustrates an example of an automatic correcting operation of the comparator circuit according to another embodiment of the present invention.

FIG. 16 is a timing waveform chart illustrating an automatic correcting operation of the comparator circuit in FIG. 15. The input voltage Va in FIG. 15 is set to the ideal determination value Vthideal. The delay amount adjusting circuit 18 monitors the value of the output Vo of the output selecting circuit 16, and adjusts the delay amount of the first or second delay circuit delay 1 or delay2 using the delay control signal TC1 or TC2. The delay amount adjusting circuit 18 detects a timing at which the output Vo changes from 1 into 0 or from 0 into 1.

The delay control signals TC1 and TC2 are in an initial state. In this state, the determination signals Vq1 and Vq1b enter a determined result state first at time t1, and the output Vo becomes vq1 (=0). The delay amount adjusting circuit 18 changes the delay control signal TC1 so as to increase the delay amount of the first delay circuit delay1 by a unit time. As a result, the determination time of the first determination signal VCq1 and Vq1b becomes longer as indicated by delay1 in FIGS. 13B and 14B. Also at time t2, therefore, the same determined result as at time t1 is obtained, and the output Vo becomes Vq1 (=0). Therefore, the delay amount adjusting circuit 18 again changes the delay control signal TC1 so as to increase the delay amount of the first delay circuit delay1 by a unit time.

In this state, the second determination signals Vq2 and Vq2b enter the determined result state first at time t3, and the output Vo becomes Vq2 (=1). That is to say, the level of the output Vo is inverted. Therefore, the delay state is such that the determination time of the first delay determination signals Vq1d and Vq1bd approximately matches the determination time of the second delay determination signals Vq2d and Vq2bd. The delay control signals TC1 and TC2 at this time are set in the delay circuits delay1 and delay2, respectively. Also, the delay control signals TC1 and TC2 may be set at time t2.

Figure 17:
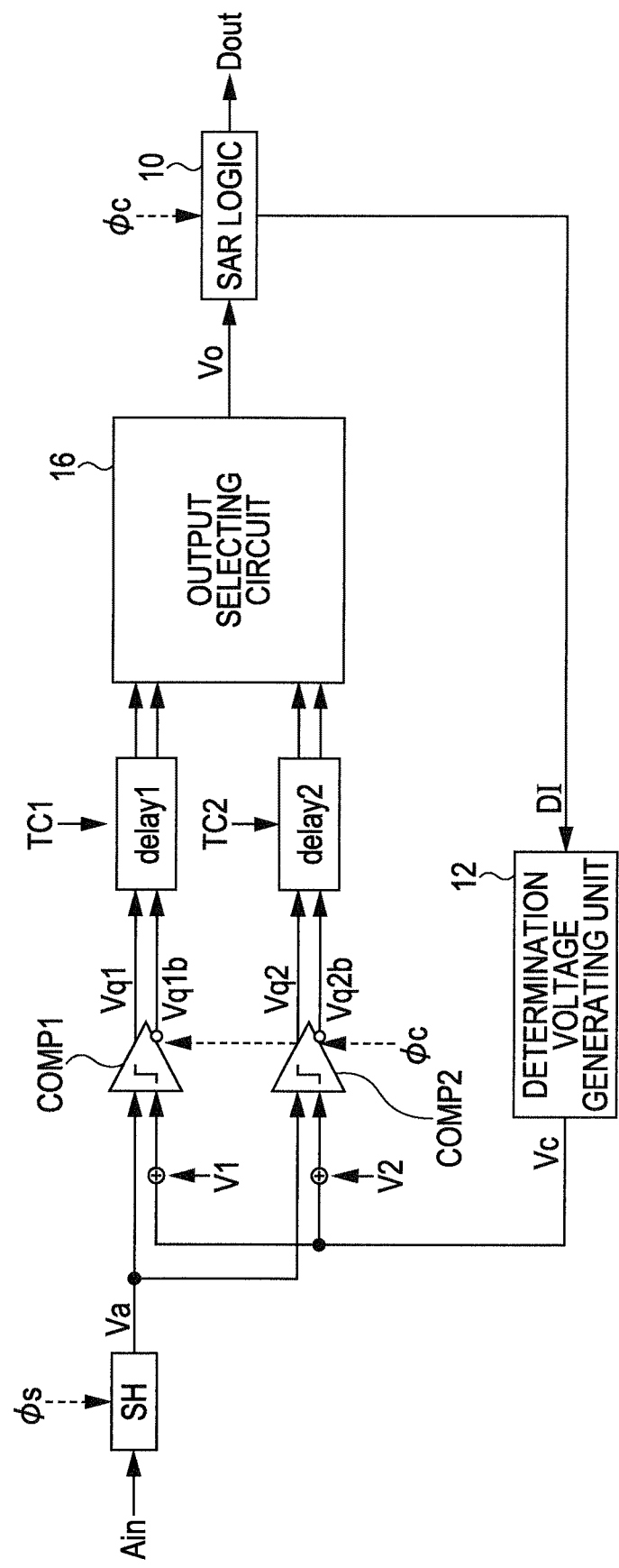
FIG. 17 illustrates one example of an ADC circuit using the comparator circuit according to another embodiment of the present invention.

FIG. 17 illustrates the ADC used in the comparator circuit in FIG. 15. The ADC is a synchronous successive approximation ADC. Compared to the ADC in FIG. 7, the synchronous successive approximation ADC in FIG. 17 has the delay circuits delay1 and delay2 between the comparators COMP1 and COMP2 and the output selecting circuit 16. The other parts of the configuration are the same as those in FIG. 7. The delay times of the delay circuits delay1 and delay2 are adjusted by the delay control signals TC1 and TC2, so that errors of the determination values due to the offsets of the comparators COMP1 and COMP2 may be corrected. Or, the delay times of the delay circuits delay1 and delay 2 may be adjusted by the delay control signals TC1 and TC2, so that the input voltage may be adjusted to desired determination values regardless of the voltages V1 and V2.

Figure 18:
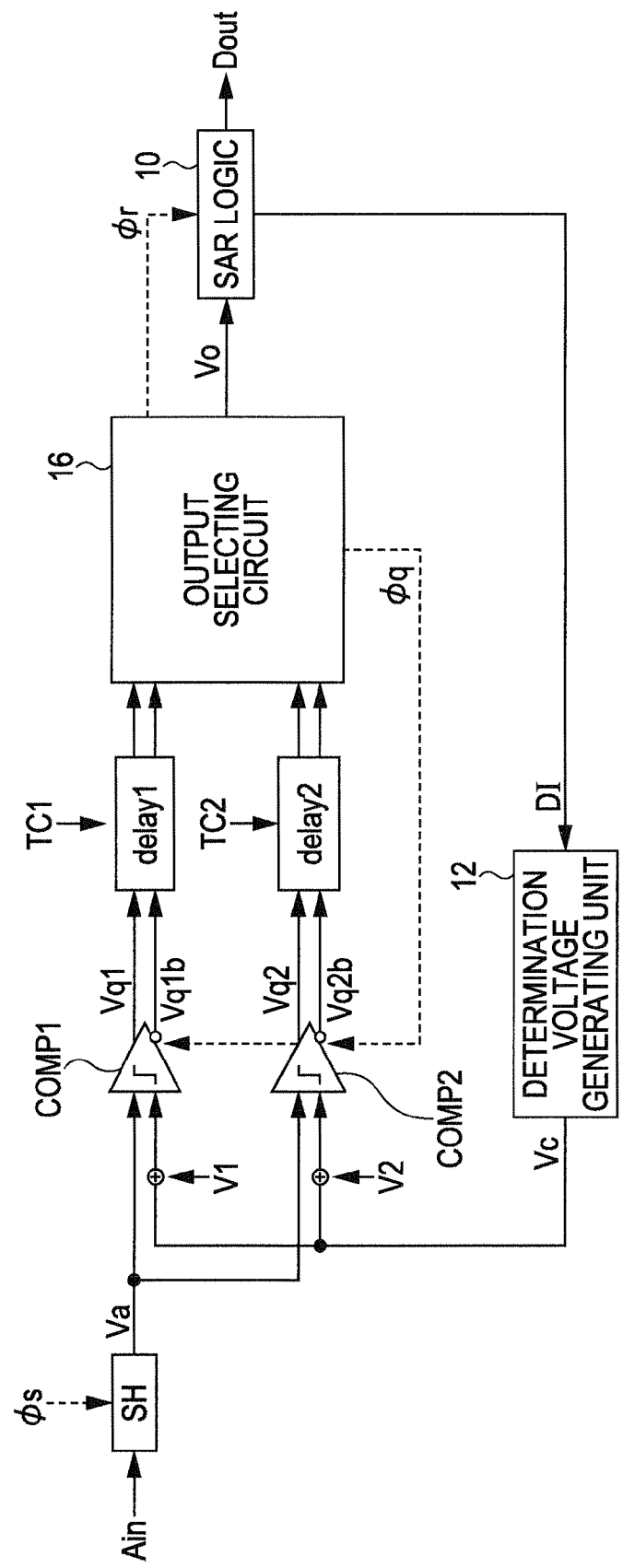
FIG. 18 illustrates another example of the ADC circuit using the comparator circuit according to another embodiment of the present invention.

FIG. 18 illustrates an example of another ADC used in the comparator circuit of FIG. 15. This ADC is a nonsynchronous successive approximation ADC. Compared to the ADC in FIG. 8, nonsynchronous successive approximation ADC in FIG. 18 has the delay circuits delay1 and delay2 between the comparators COMP1 and COMP1 and the output selecting circuit 16. Other parts of the configuration are the same as those in FIG. 8.

Figure 19:
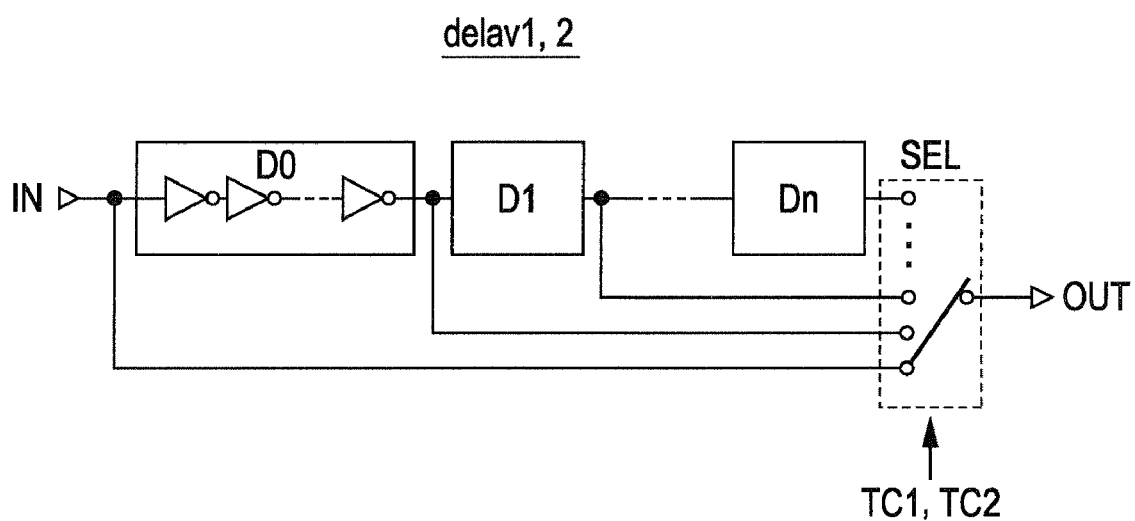
FIG. 19 illustrates a circuit example of delay circuits 1 and 2 of the ADC circuit in FIGS. 17 and 18.

FIG. 19 illustrates an example of the first delay circuit delay1 and the first delay circuit delay2. The delay circuit has delay units D0, D1 to Dn each having a plurality of inverters, and a selector SEL which selects and outputs any one of the outputs from the delay units. The selector SEL is set by the delay control signal TC1 or TC2.

In the above embodiment, the ADC compares the input voltage Va sampled and held by the comparator circuit to the determination value generated by the determination value generating unit 12. However, an ADC with a configuration where the determination voltage value generating unit 12 including the digital-analog converter DAC holds an analog input voltage, which is sampled and held, and changes the held input voltage according to the digital input signal DI generated by the SAR logic circuit 10 according to the determined result, so that the comparator compares the changed voltage to the standard value Vth and determine the changed voltage, may also be used. Such an ADC is described in, for example, FIG. 2 of the non-patent document Jens Sauerbrey, Doris Schmitt-Landsiedel, Roland Thewes; "A0.5V, 1 μW successive approximation ADC", Proceedings of the 28th European Solid-State Circuits Conference, September 2002. The determination voltage value generating unit described in the document is a charge partitioning ADC which repartitions charges caused by the analog input voltage held first according to the digital input signal DI.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A comparator circuit comprising:
   a first comparator comparing an input signal to a first comparison value and generating a first determination signal;
   a second comparator comparing the input signal to a second comparison value different from the first comparison value and generating a second determination signal; and
   an output selecting circuit selecting one of the first determination signal and the second determination signal which is generated first, and outputting the selected signal as a third determination signal indicating whether the input signal is larger or smaller than a determination value;
   wherein the output selecting circuit responds to a change of any one of the first determination signal and the second determination signal into a value of the determined result, so as to select and output the first determination signal or the second determination signal which changed into the value of the determined result.

2. A comparator circuit comprising:
   a first comparator comparing an input signal to a first comparison value and generating a first determination signal;
   a second comparator comparing the input signal to a second comparison value different from the first comparison value and generating a second determination signal; and
   an output selecting circuit selecting one of the first determination signal and the second determination signal which is generated first, and outputting the selected signal as a third determination signal indicating whether the input signal is larger or smaller than a determination value;
   wherein the first comparison value is larger than the determination value by a first value, and the second comparison value is smaller than the determination value by the first value.

3. The comparator circuit according to claim 2,
   wherein the first comparator has a first transistor which receives the input signal at a first gate electrode and supplies a first electric current to a first output terminal, a second transistor which receives the first comparison value at a second gate electrode and supplies a second electric current to a second output terminal, and a first amplifying circuit which amplifies a potential difference between the first output terminal and the second output terminal, and
   the second comparator has a third transistor which receives the input signal at a third gate electrode and supplies a third electric current to a third output terminal, a fourth transistor which receives the second comparison value at a fourth gate electrode and supplies a fourth electric current to a fourth output terminal, and a second amplifying circuit which amplifies a potential difference between the third output terminal and the fourth output terminal.

4. A comparator circuit comprising:

a first comparator comparing an input signal to a first comparison value and generating a first determination signal;

a second comparator comparing the input signal to a second comparison value different from the first comparison value and generating a second determination signal; and an output selecting circuit selecting one of the first determination signal and the second determination signal which is generated first, and outputting the selected signal as a third determination signal indicating whether the input signal is larger or smaller than a determination value;

wherein the output selecting circuit outputs a determination completion signal after selecting any one of the first determination signal and the second determination signal.

5. The comparator circuit according to claim 1, wherein the first comparator has a first transistor which receives the input signal at a first gate electrode and supplies a first electric current to a first output terminal, a second transistor which receives the first comparison value at a second gate electrode and supplies a second electric current to a second output terminal, and a first amplifying circuit which amplifies a potential difference between the first output terminal and the second output terminal, and the second comparator has a third transistor which receives the input signal at a third gate electrode and supplies a third electric current to a third output terminal, a fourth transistor which receives the second comparison value at a fourth gate electrode and supplies a fourth electric current to a fourth output terminal, and a second amplifying circuit which amplifies a potential difference between the third output terminal and the fourth output terminal.

6. The comparator circuit according to claim 5, wherein the first amplifying circuit latches the electric potentials of the first output terminal and the second output terminal to H level or L level, the second amplifying circuit latches the electric potentials of the third output terminal and the fourth output terminal to H level or L level.

7. A comparator circuit comprising:

a first comparator comparing an input signal to a first comparison value and generating a first determination signal;

a second comparator comparing the input signal to a second comparison value different from the first comparison value and generating a second determination signal; and an output selecting circuit selecting one of the first determination signal and the second determination signal which is generated first, and outputting the selected signal as a third determination signal indicating whether the input signal is larger or smaller than a determination value;

a delay circuit which delays any one of the first determination signal and the second determination signal, and supplies the delayed first determination signal or the delayed second determination signal to the output selecting circuit.

8. The comparator circuit according to claim 7, further comprising a delay amount adjusting circuit which supplies a delay adjusting signal to the delay circuit according to an output of the output selecting circuit.

9. The comparator circuit according to claim 7, wherein the first comparison value is larger than the determination value by a first value, and the second comparison value is smaller than the determination value by the first value.

10. An analog-digital converter comprising:

a first comparator comparing an analog input signal to a first comparison value and generating a first determination signal;

a second comparator comparing the analog input signal to a second comparison value different from the first comparison value and generating a second determination signal;

an output selecting circuit selecting a signal generated first from the first determination signal and the second determination signal, and outputting the selected signal as a third determination signal indicating whether the input signal is higher or lower than a determination value;

a register circuit storing the third determination signal and outputting a digital output signal; and a comparison value generating unit generating the first comparison value and the second comparison value according to the third determination signal;

wherein the output selecting circuit outputs a determination completion signal after selecting the first determination signal or the second determination signal, the first comparator and the second comparator respond to the determination completion signal and perform a reset operation, the comparison value generating unit generates the first comparison value and the second comparison value in response to the determination completion signal.

11. The analog-digital converter according to claim 10, wherein the comparison value generating unit has a determination value generating circuit which generates a determination value according to the determined signal, and adds a first shift value and a second shift value to the determination value so as to generate the first comparison value and the second comparison value.

12. The analog-digital converter according to claim 10, wherein the first comparator and the second comparator repeat a reset operation and a determining operation in synchronization with a determination clock.

13. The analog-digital converter according to claim 10, further comprising a delay circuit which delays any one of the first determination signal and the second determination signal, and supplies the delayed first determination signal or the delayed second determination signal to the output selecting circuit.

14. The analog-digital converter according to claim 13, further comprising a delay amount adjusting circuit which supplies a delay adjusting signal to the delay circuit according to an output of the output selecting circuit.

* * * * *